United States Patent
Lo

(10) Patent No.: US 10,818,508 B2
(45) Date of Patent: Oct. 27, 2020

(54) SEMICONDUCTOR STRUCTURE AND METHOD FOR PREPARING THE SAME

(71) Applicant: NANYA TECHNOLOGY CORPORATION, New Taipei (TW)

(72) Inventor: Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 106 days.

(21) Appl. No.: 16/162,729

(22) Filed: Oct. 17, 2018

(65) Prior Publication Data

US 2020/0126806 A1 Apr. 23, 2020

(51) Int. Cl.
*H01L 21/311* (2006.01)
*H01L 21/02* (2006.01)

(52) U.S. Cl.
CPC .... *H01L 21/31144* (2013.01); *H01L 21/0206* (2013.01); *H01L 21/31116* (2013.01)

(58) Field of Classification Search
CPC .................................. H01L 21/31144
See application file for complete search history.

(56) References Cited

U.S. PATENT DOCUMENTS

| 6,762,099 B1 * | 7/2004 | Yu-Sheng ......... H01L 27/10864 257/E21.652 |
| 2006/0211260 A1 | 9/2006 | Tran et al. |
| 2013/0302968 A1 * | 11/2013 | Lin ................... H01L 21/76224 438/424 |
| 2014/0170853 A1 | 6/2014 | Shamma et al. |

* cited by examiner

*Primary Examiner* — Mohammad M Choudhry
(74) *Attorney, Agent, or Firm* — Muncy, Geissler, Olds & Lowe, P.C.

(57) ABSTRACT

The present disclosure provides a method for preparing semiconductor structures. The method includes steps of providing a stack structure, wherein the stack structure comprises a nitride layer, a first layer, a stop layer, a second layer, and a first oxide layer stacked in sequence; forming a third layer on the first oxide layer; patterning the third layer to obtain a line-and-space pattern comprising a plurality of first lines and a plurality of first spaces; forming a second oxide layer on the line-and-space pattern; removing the second oxide layer on the first lines; removing the first lines to form a plurality of second spaces; and etching the first oxide layer, the second layer, and the stop layer via the second spaces to form a plurality of second lines.

12 Claims, 12 Drawing Sheets

SEMICONDUCTOR STRUCTURE AND METHOD FOR PREPARING THE SAME

TECHNICAL FIELD

The present disclosure relates to a semiconductor structure and method for preparing the same, and more particularly, to a semiconductor structure having a stacked structure, with a designed critical dimension, and a patterning method for preparing the same.

DISCUSSION OF THE BACKGROUND

Semiconductor devices are being made in smaller and smaller sizes to be more compact for mobile computing applications and to consume less energy to extend battery life between charges. The technology used to reduce the size of semiconductor devices can also facilitate increases in circuit density so as to allow the semiconductor devices to have more computing power. Technological advances to date have been consistently limited by the resolution of photolithographic equipment available at a given time.

The minimum sizes of features and spaces are directly related to the resolution capability of photolithographic equipment. In semiconductor devices, repeating patterns, typical of memory arrays, are measured by a pitch that is defined as the distance between identical points in two adjacent features. Generally, the pitch can be viewed as the sum of the width of a feature and the width of a space or material separating two adjacent features. Limited by the resolution of available photolithographic equipment, features below a minimum pitch cannot be reliably obtained.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a nitride layer, a first layer, a stop layer, a second layer, a first oxide layer, and a second oxide layer. The first layer is disposed on the nitride layer. The stop layer is disposed on the first layer and includes a base and a plurality of protrusions disposed over the base. The second layer is disposed on the stop layer and has a plurality of segments disposed over the protrusions, respectively. The first oxide layer is disposed on the second layer and has a plurality of first blocks disposed over the segments, respectively. The second oxide layer is disposed on the first oxide layer and has a plurality of second blocks disposed over the first blocks, respectively. A critical dimension of a stacked structure including the protrusion, the segment, the first block, and the second block stacked in sequence is less than 37 nanometers.

In some embodiments, a critical dimension of a stacked structure including the protrusion, the segment, the first block, and the second block stacked in sequence is in a range of 20 nanometers to 24 nanometers.

In some embodiments, a critical dimension of each of spaces between adjacent pairs of stacked structures is in a range of 11 nanometers to 15 nanometers.

Another aspect of the present disclosure provides a method for preparing semiconductor structures. The method includes steps of providing a stack structure, wherein the stack structure comprises a nitride layer, a first layer, a stop layer, a second layer, and a first oxide layer stacked in sequence; forming a third layer on the first oxide layer; patterning the third layer to obtain a line-and-space pattern comprising a plurality of first lines and a plurality of first spaces; forming a second oxide layer on the line-and-space pattern; removing the second oxide layer on the first lines; removing the first lines to form a plurality of second spaces; and etching the first oxide layer, the second layer, and the stop layer via the second spaces to form a plurality of second lines.

In some embodiments, a critical dimension of each of the plurality of second lines is in a range of 20 nanometers to 24 nanometers, and a critical dimension of each of a plurality of third spaces formed between adjacent pairs of second lines is in a range of 11 nanometers to 15 nanometers.

In some embodiments, the step of patterning the third layer to obtain the line-and-space pattern includes steps of providing a photoresist layer on the third layer; patterning the photoresist layer; performing a first etching to remove a portion of the third layer; and stripping the photoresist layer.

In some embodiments, portions of the first oxide layer are exposed to the first spaces after the patterning of the third layer.

In some embodiments, a thickness of the second oxide layer formed on a top surface and a sidewall of each of the first lines and the first oxide layer is consistent.

In some embodiments, the method further comprises steps of forming a fill material on the second oxide layer; removing the fill material over the first lines while removing the second oxide layer on the first lines; and completely removing the fill material while removing the first lines.

In some embodiments, the second oxide layer on the first lines and the fill material over the first lines are removed by using a second etching process, which includes using carbon tetrafluoromethane (CF4) as a reactive gas.

In some embodiments, the first lines and the fill material are removed by an ashing process, which includes using oxygen ($O_2$) as a reactive gas.

In some embodiments, a height of the fill material formed over the first lines is substantially less than a height of the fill material formed within the first spaces.

In some embodiments, portions of the first oxide layer are exposed to the second spaces.

In some embodiments, the semiconductor structure has an active area and a peripheral area encircling the active area, wherein the second lines and the second spaces are located in the active area.

In some embodiments, a height of the first oxide layer in the active area is less than a height of the first oxide layer in the peripheral area, and a height of the third layer in the active area is greater than a height of the third layer in the peripheral area, such that an upper surface of the third layer is substantially planar.

By the method described above, the critical dimensions of the stacked structure including each of the protrusions, each of the segments, each of the first blocks, and each of the second blocks stacked in sequence and the space between two adjacent stacked structures can meet requirements, and can facilitate the subsequent production processes.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
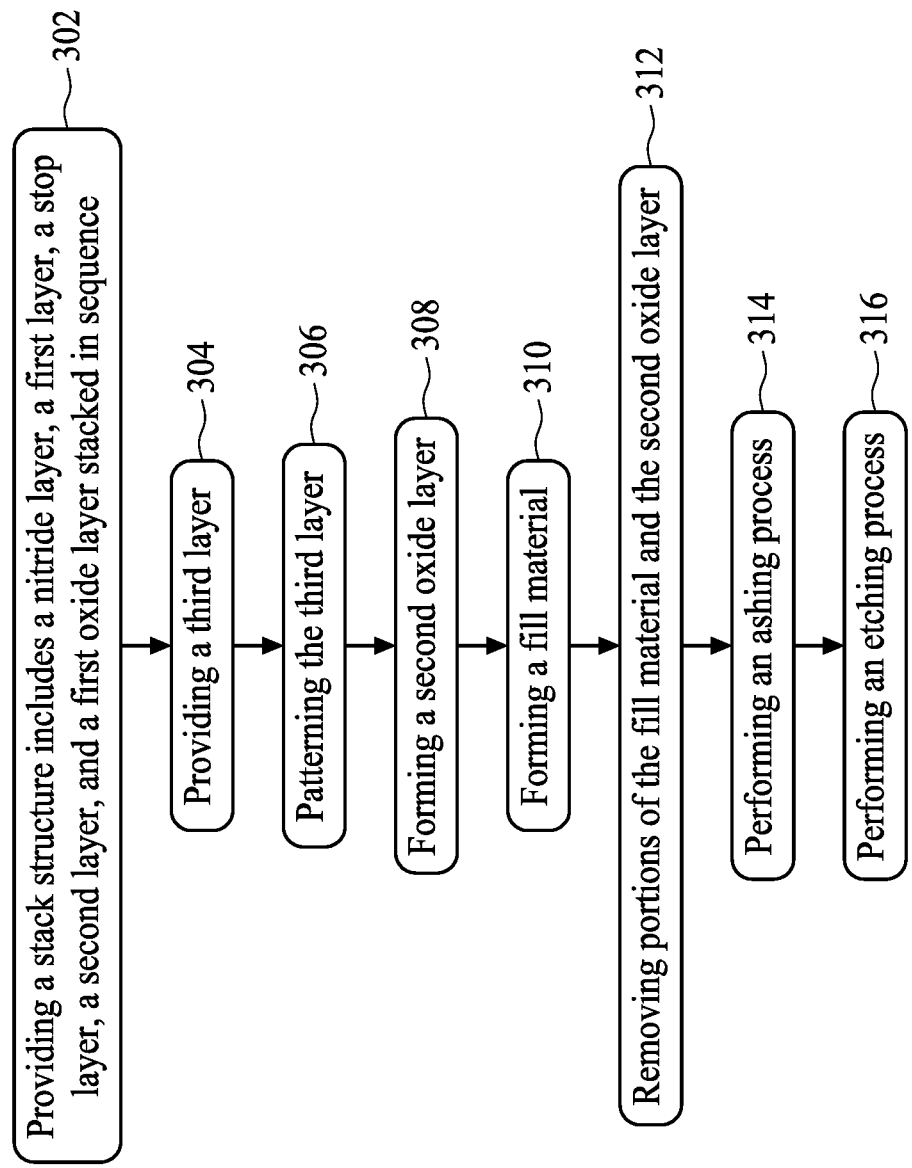
FIG. 1 is a flow diagram illustrating a method for preparing semiconductor structures, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method for preparing semiconductor structures, in accordance with some embodiments of the present disclosure. FIGS. 2 to 14 are schematic diagrams illustrating various fabrication stages constructed according to the method for preparing the semiconductor structures in accordance with some embodiments of the present disclosure. The steps shown in FIGS. 2 through 14 are also illustrated schematically in the process flow shown in FIG. 1. In the subsequent discussion, the process steps shown in FIGS. 2 through 14 are discussed in reference to the process steps in FIG. 1.

Figure 2:
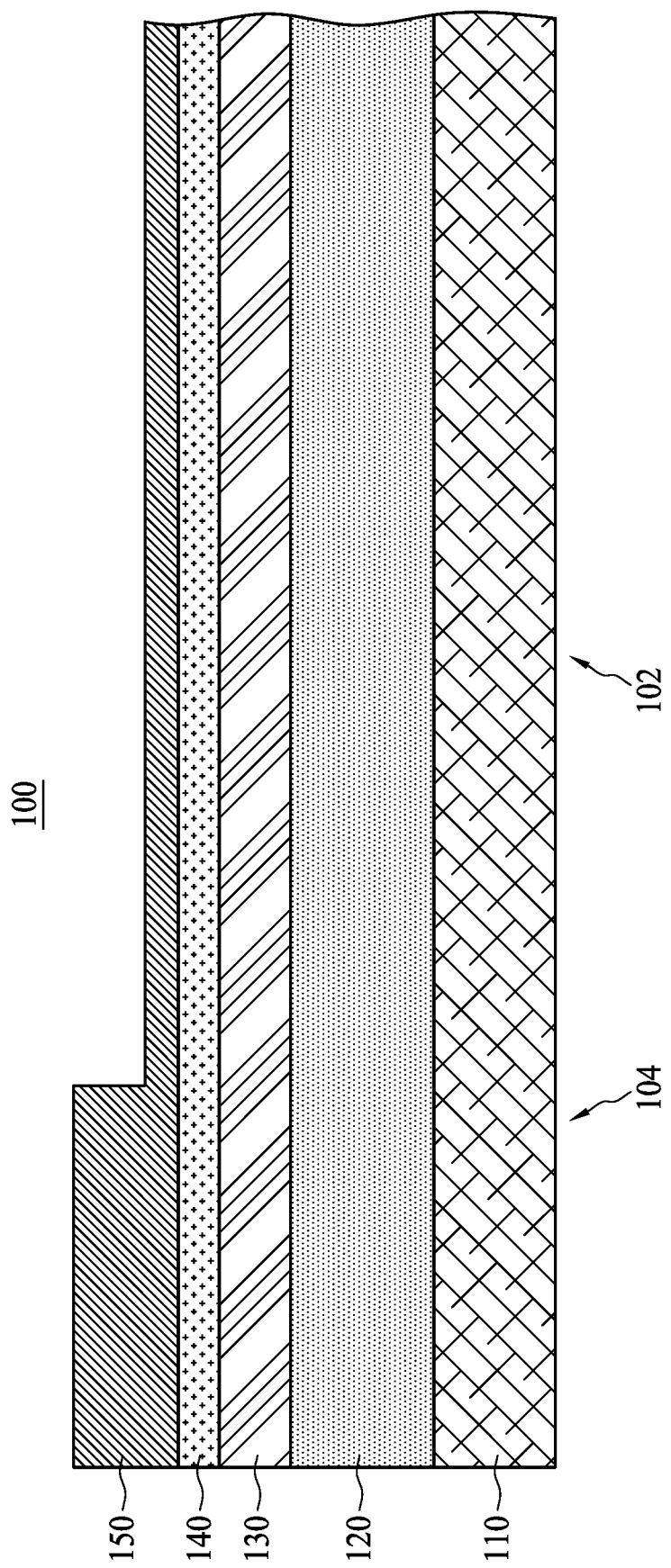
FIGS. 2 to 12 are schematic diagrams illustrating various fabrication stages of the method for preparing the semiconductor structures in accordance with some embodiments of the present disclosure.

Referring to FIG. 2, a stack structure 100 is provided; the stack structure 100 includes a nitride layer 110, a first layer 120, a stop layer 130, a second layer 140, and a first oxide layer 150 stacked in sequence according to a step 302 shown in FIG. 1. In some embodiments, the semiconductor structure 100 may further include a substrate for carrying the stack structure 100. In some embodiments, the semiconductor structure 100 has an active area 102 and a peripheral area 104 encircling the active area 102.

In some embodiments, the nitride layer 110 is, with a thickness of approximately, but not limited to, in a range of 80 to 100 nanometers. In some embodiments, the nitride layer 110 is a silicon nitride layer. In some embodiments, a thickness of the nitride layer 110 in the active area 102 and the peripheral area 104 is consistent.

In some embodiments, a thickness of the first layer 120 is substantially in a range of 110 nanometers to 140 nanometers. In some embodiments, thicknesses of the first layer 120 in the active area 102 and the peripheral area 104 are consistent. In some embodiments, the first layer 120 includes carbon. In some embodiments, the first layer 120 is a carbon film.

In some embodiments, the stop layer 130 includes nitride. In some embodiments, the stop layer 130 is a silicon nitride layer. In some embodiments, a material of the stop layer 130 is the same as a material of the nitride layer 110. In some embodiments, a thickness of the stop layer 130 is less than a thickness of the nitride layer 110. In some embodiments, the thickness of the stop layer 130 is substantially in a range of 40 nanometers to 55 nanometers. In some embodiments, thicknesses of the stop layer 130 in the active area 102 and the peripheral area 104 are consistent.

In some embodiments, a thickness of the second layer 140 is substantially in a range of 6 nanometers to 17 nanometers. In some embodiments, thicknesses of the second layer 140 in the active area 102 and the peripheral area 104 are consistent. In some embodiments, the second layer 140 includes silicon. In some embodiments, the second layer is an amorphous silicon (a-Si) film.

In some embodiments, a thickness of the first oxide layer 150 is substantially in a range of 50 nanometers to 70 nanometers. In some embodiments, the thickness of the first oxide layer 150 in the peripheral area 104 is different from the thickness of the first oxide layer 150 in the active area 102. In some embodiments, the thickness of the first oxide layer 150 in the peripheral area 104 is greater than the thickness of the first oxide layer 150 in the active area 102. In some embodiments, the first oxide layer 150 is a silicon oxide layer.

Figure 3:
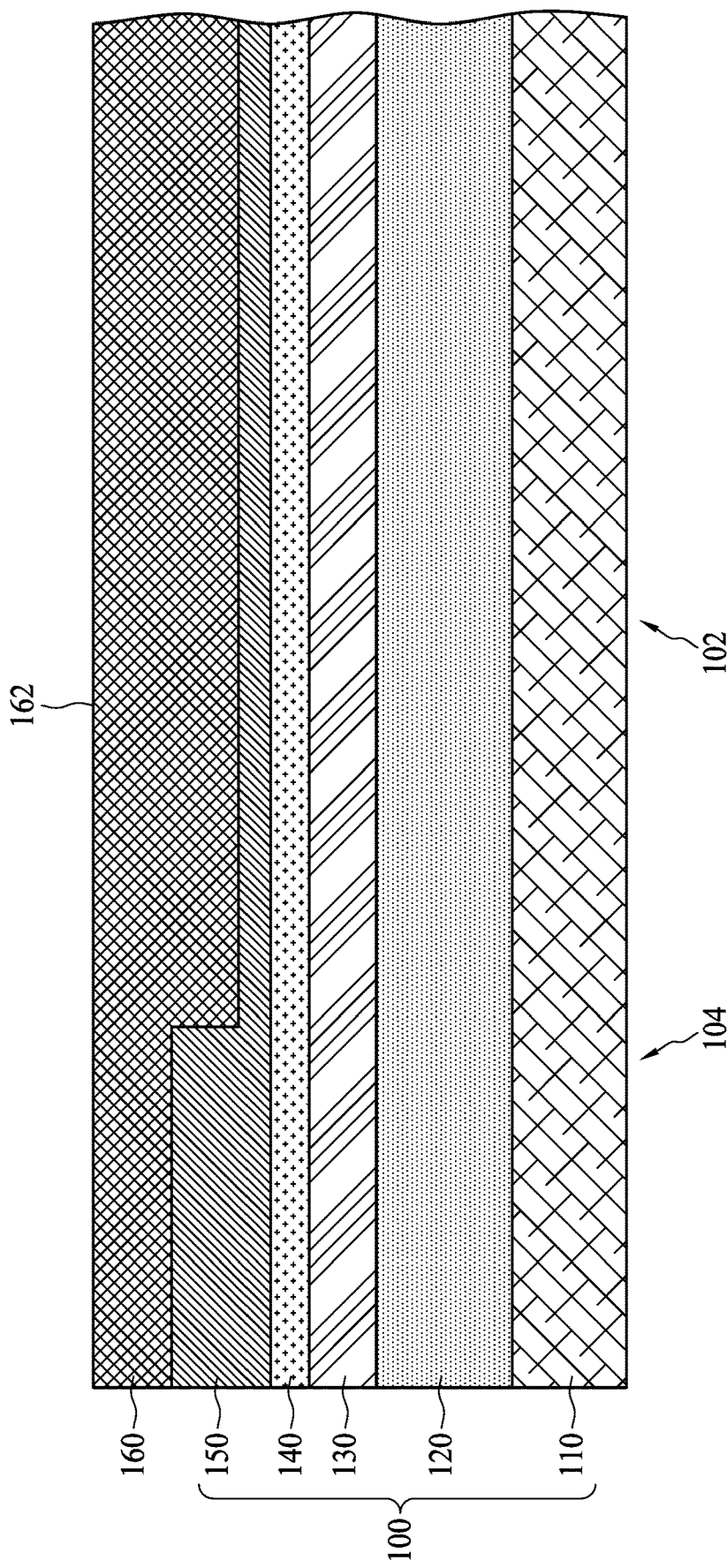

Referring to FIG. 3, a third layer 160 is provided on the first oxide layer 150 of the stack structure 100 according to a step 304 shown in FIG. 1. In some embodiments, a thickness of the third layer 160 is substantially in a range of 150 nanometers to 220 nanometers. In some embodiments, the thickness of the third layer 160 in the peripheral area 104 is different from the thickness of the third layer 160 in the active area 102. In some embodiments, the thickness of the third layer 160 in the peripheral area 104 is less than the thickness of the third layer 160 in the active area 102. In some embodiments, the third layer 160 has an upper surface 162, which is substantially planar. In some embodiments, the third layer 160 is a photoresist.

Figure 4:
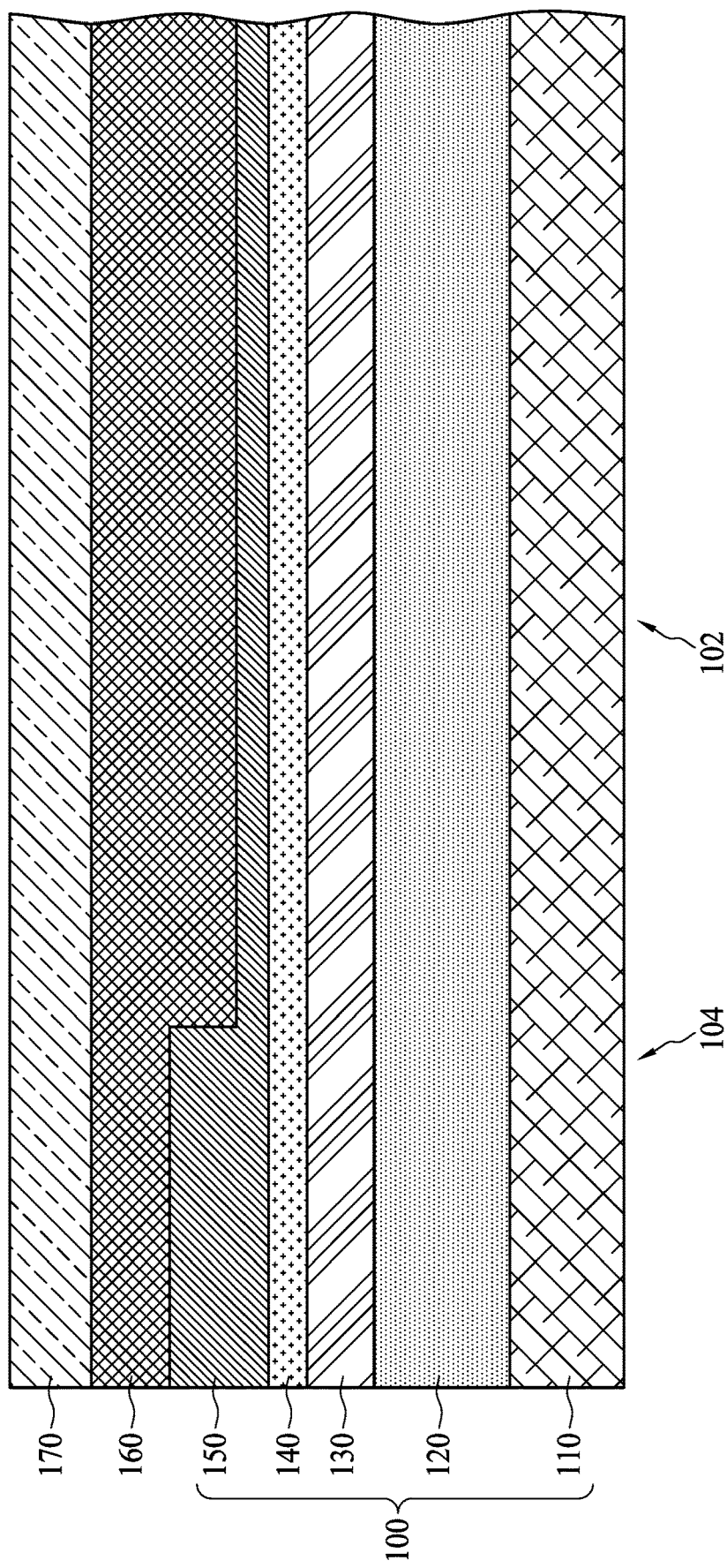
Figure 5:
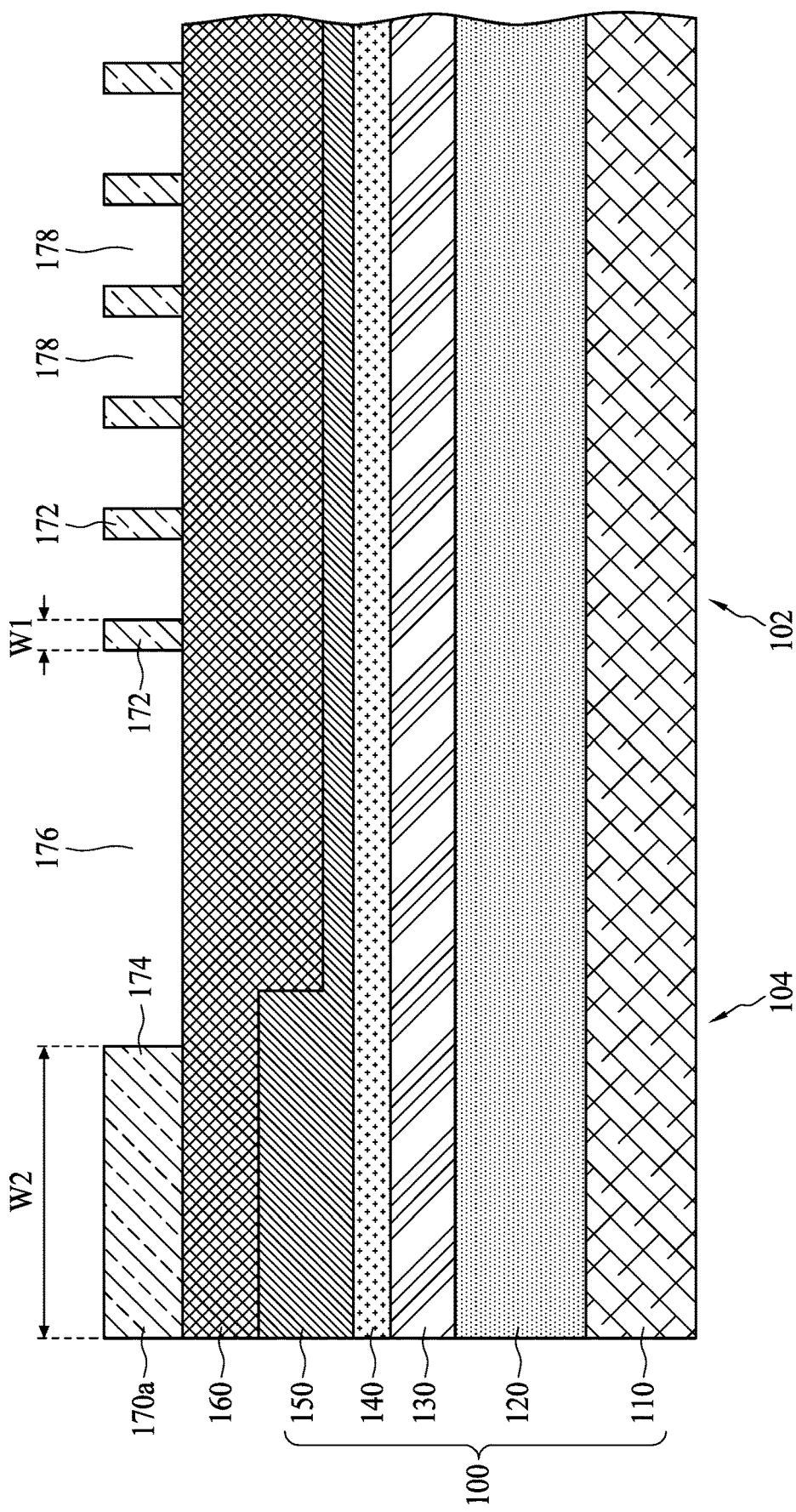

Referring to FIG. 4, a photoresist layer 170 is deposited on the third layer 160, and the photoresist layer 170 is patterned to form a line-and-space pattern 170a as shown in FIG. 5. In some embodiments, the line-and-space pattern 170a (located in the active area 102) has a minimum pitch that is achievable with current photolithographic equipment. In some embodiments, lines 172 in the active area 102 have substantially the same line width W1 as that seen in a side view of the line-and-space pattern 170a, and the lines 172 are equally spaced from each other. In some embodiments, a line width W2 of a line 174 in the peripheral area 104 is different from the line width W1 of each of the lines 172 in the active area 102 as seen in a side view of the line-and-space pattern 170a. In some embodiments, the line width W1 is substantially greater than the line width W2. In some embodiments, a space 176 between the lines 174 and the adjacent lines 172 is substantially greater than a space 178 between an adjacent pair of lines 172.

Figure 6:
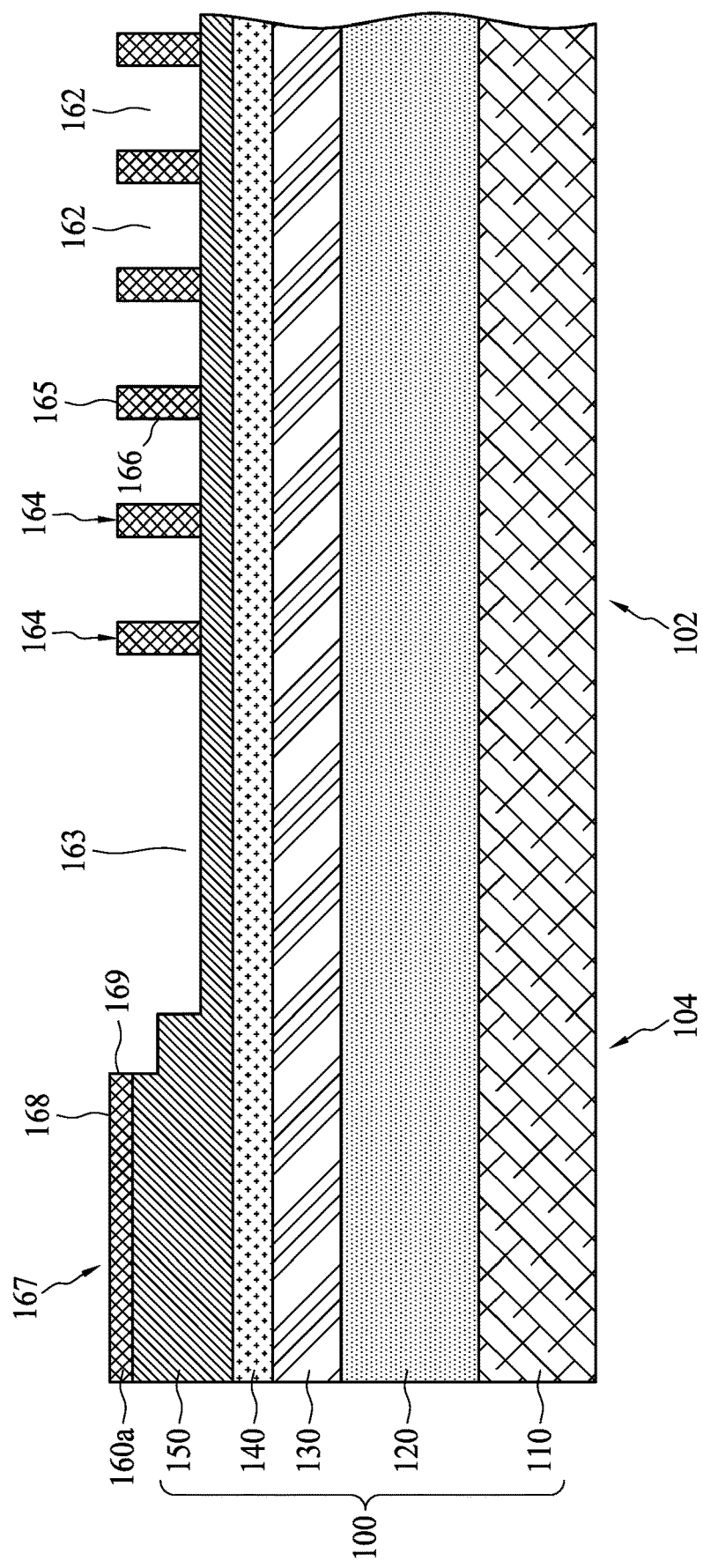

Referring to FIG. 6, a first etching process, for example a dry etching process, is performed to pattern the third layer 160 according to a step 306 shown in FIG. 1. The third layer 160 is patterned such that another line-and-space pattern 160a, including a plurality of first spaces 162 and 163 and a plurality of first lines 164 and 167, is obtained after the line-and-space pattern 170a is stripped. In some embodiments, portions of the first oxide layer 150 are exposed to the first spaces 162 and 163. In some embodiments, each of the first spaces 162 is substantially smaller than the first space 163.

Figure 7:
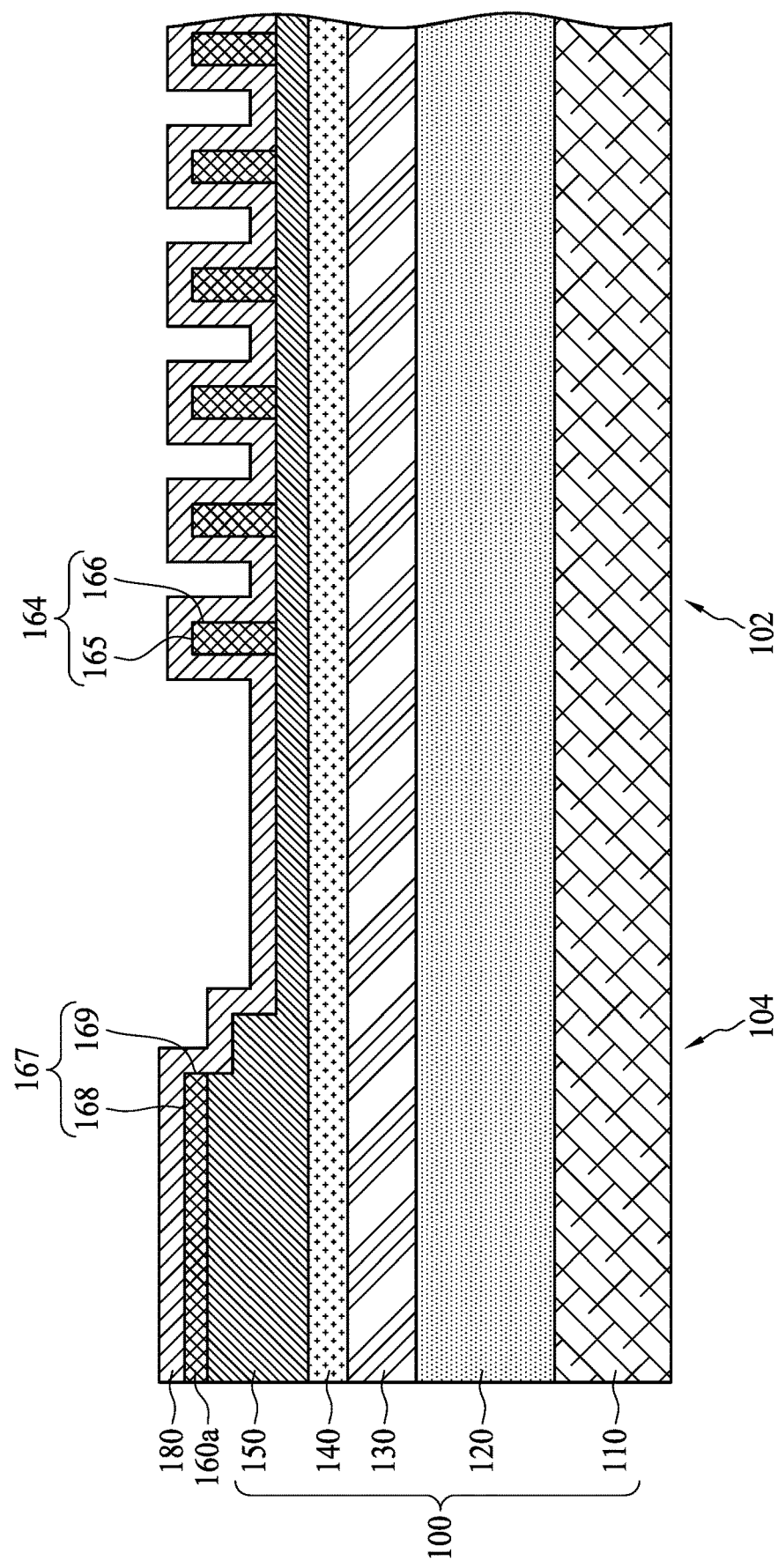

Referring to FIG. 7, a second oxide layer 180 is formed or deposited on the first lines 164 and 167 of the line-and-space pattern 160a and on the first oxide layer according to a step 308 shown in FIG. 1. In some embodiments, the second oxide layer 180 is formed on a top surface 165 and a sidewall 166 of each of first lines 164 (as shown in FIG. 6), wherein the first lines 164 are equally spaced from each other in the active area 102. The second oxide layer 180 is also formed over a top surface 168 and a sidewall 169 of a first line 167 in the peripheral area 104, and the second oxide layer 180 is formed over the first oxide layer 150, which is exposed to the first spaces 162 and 163. In some embodiments, the second oxide layer 180 has a consistent thickness. In some embodiments, the second oxide layer 180 includes an atomic layer deposition oxide. In some embodiments, the second oxide layer 180 is formed by an atomic layer deposition (ALD) process.

Figure 8:
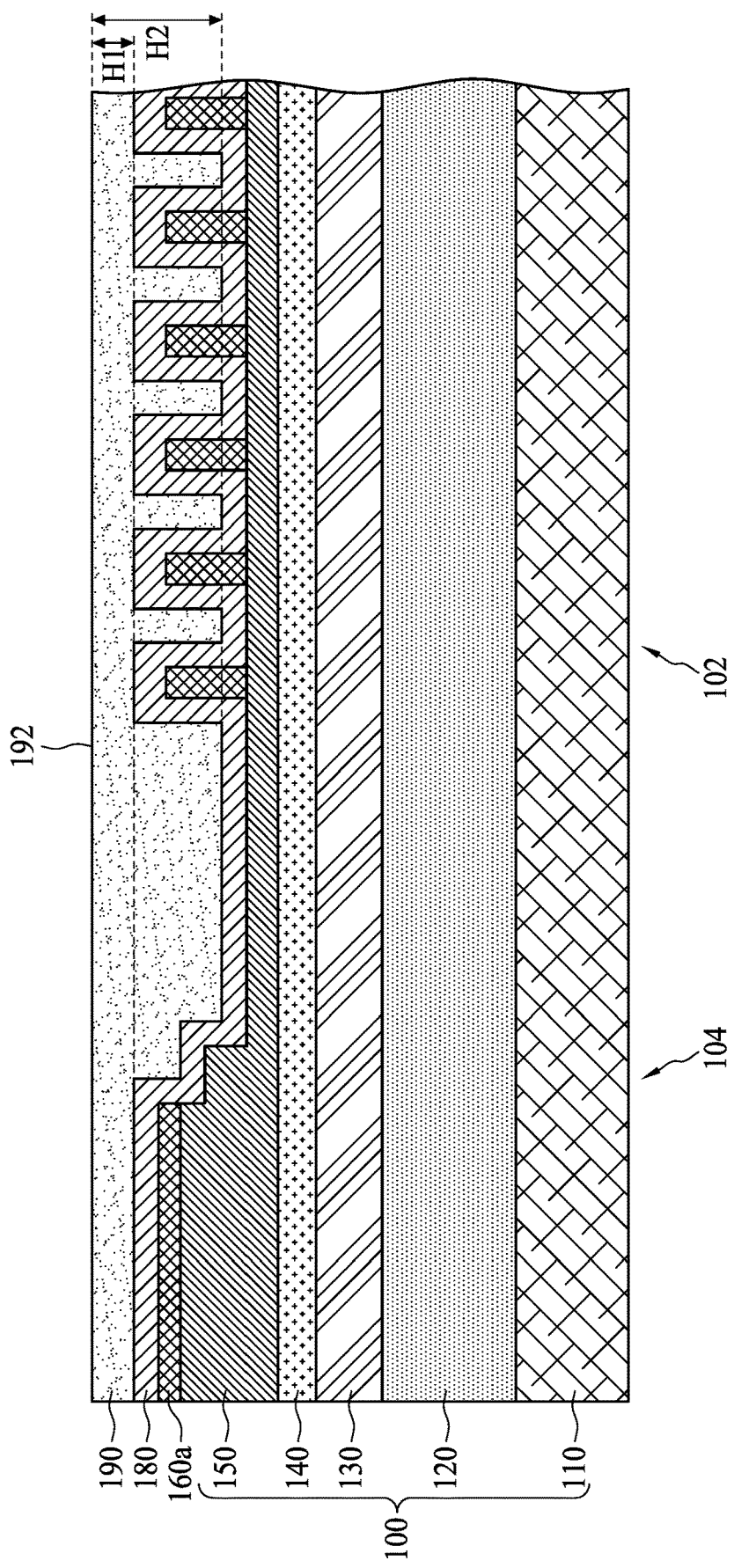

Referring to FIG. 8, a fill material 190 is provided over the second oxide layer 180 according to a step 310 shown in FIG. 1. In some embodiments, a height H1 of the fill material formed over the first lines 164 and 167 is substantially less than a height of the fill material formed within the first spaces 162 and 163. In some embodiments, the fill material 190 has a front surface 192, which is substantially planar. In some embodiments, the fill material 190 is a dielectric material.

Figure 9:
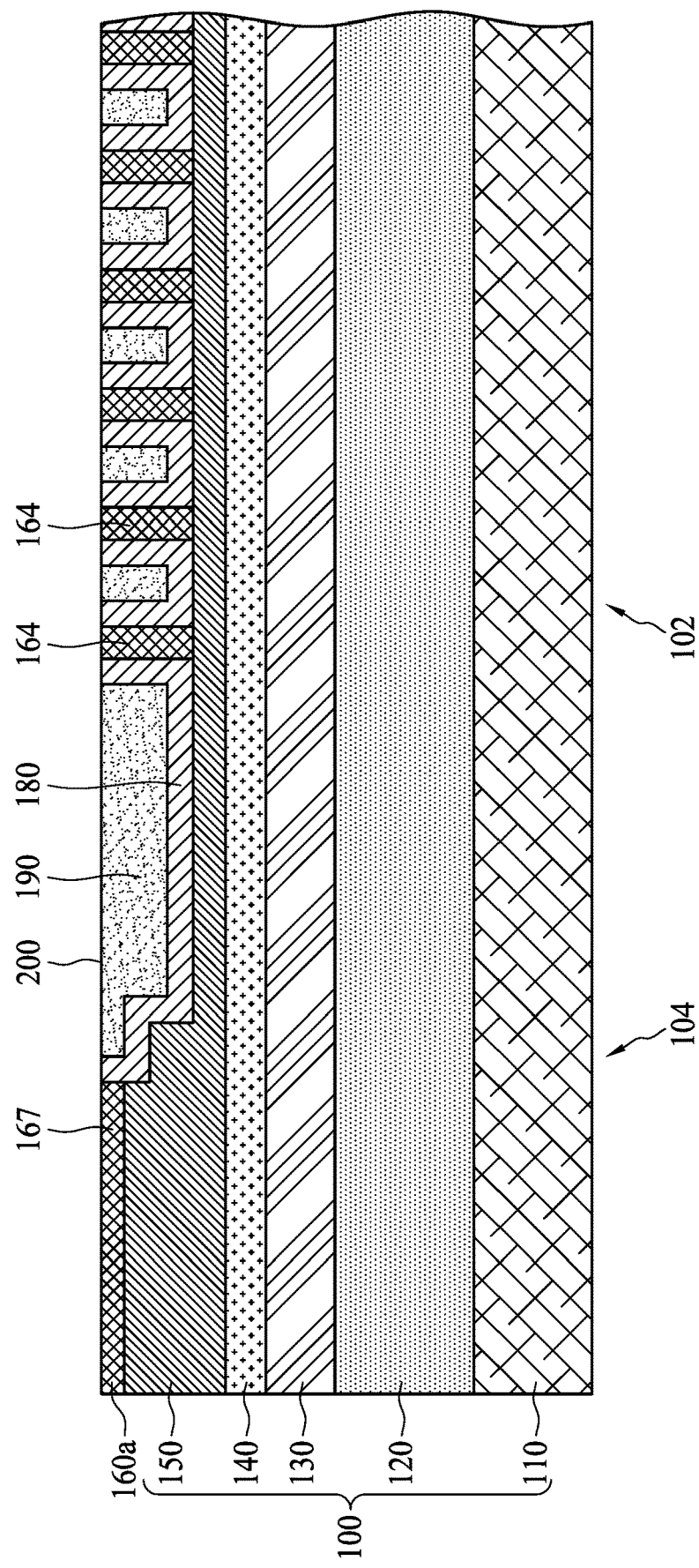

Referring to FIG. 9, a portion of the fill material 190 above the second oxide layer 180 above the first lines 164 and 167, and a portion of the second oxide layer 180 above the first lines 164 and 167, are removed according to a step 312 shown in FIG. 1. In some embodiments, the portion of the fill material 190 and the portion of the second oxide layer 180 are removed using a second etching process, for example a dry etching process, which is stopped at the first lines 164 and 167. In some embodiments, the second etching process includes using carbon tetrafluoromethane (CF4) as a reactive gas. In some embodiments, a surface 200 of the semiconductor structure after the second etching process is substantially planar.

Figure 10:
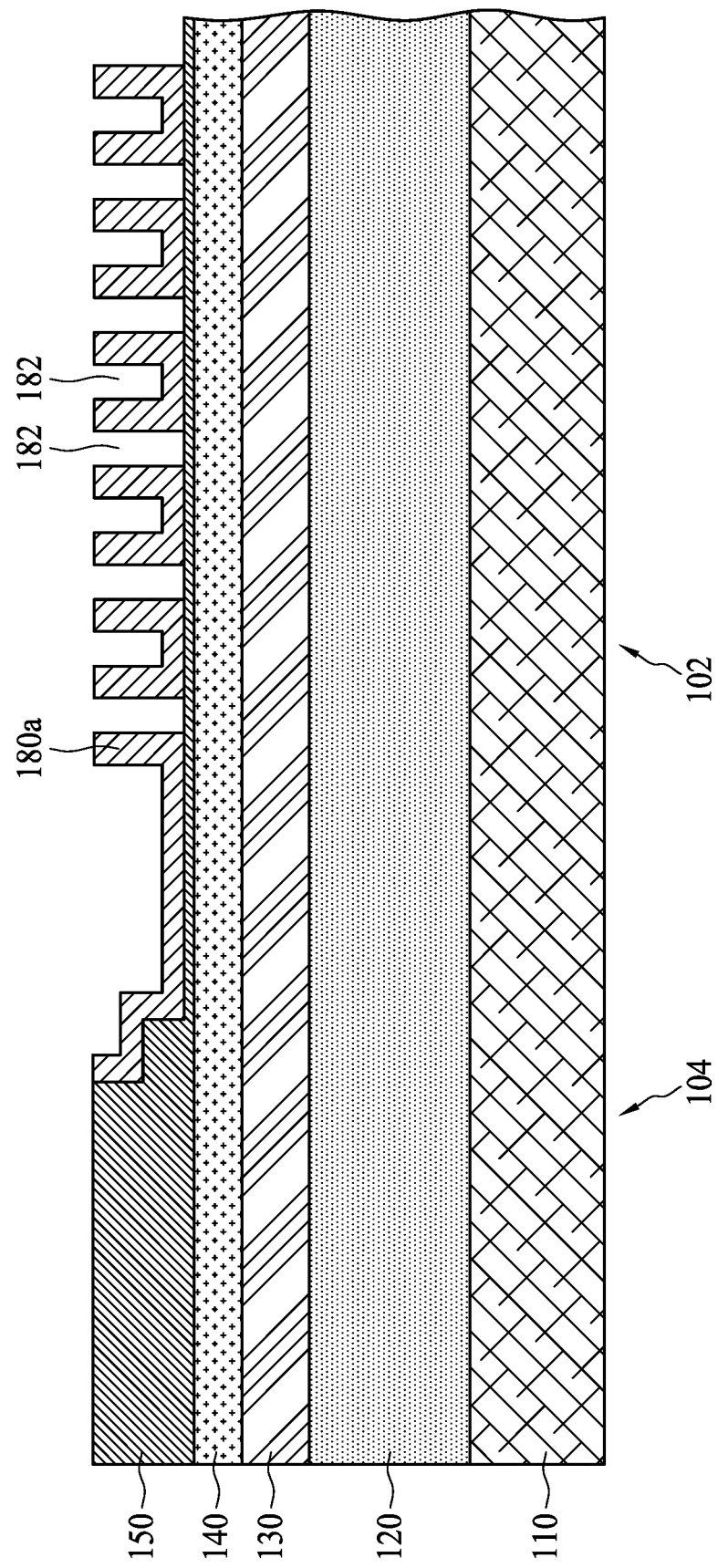

Referring to FIG. 10, an ashing process is performed to remove the first lines 164 and 167, and to remove the fill material 190 (as shown in FIG. 9), to form a plurality of second spaces 182 according to a step 314 shown in FIG. 1. In some embodiments, the second oxide layer 180 and portions of the first oxide layer 150 are exposed to the second spaces 182. In some embodiments, the ashing process includes using oxygen ($O_2$) as a reactive gas. In some embodiments, the remaining second oxide layer segments 180a have a substantially U-shaped contour as seen from a side view of the semiconductor structure. In some embodiments, the second spaces 182 include spaces formed between adjacent pairs of the second oxide layer segments 180a and openings of each of the second oxide layer segments 180a.

Figure 11:
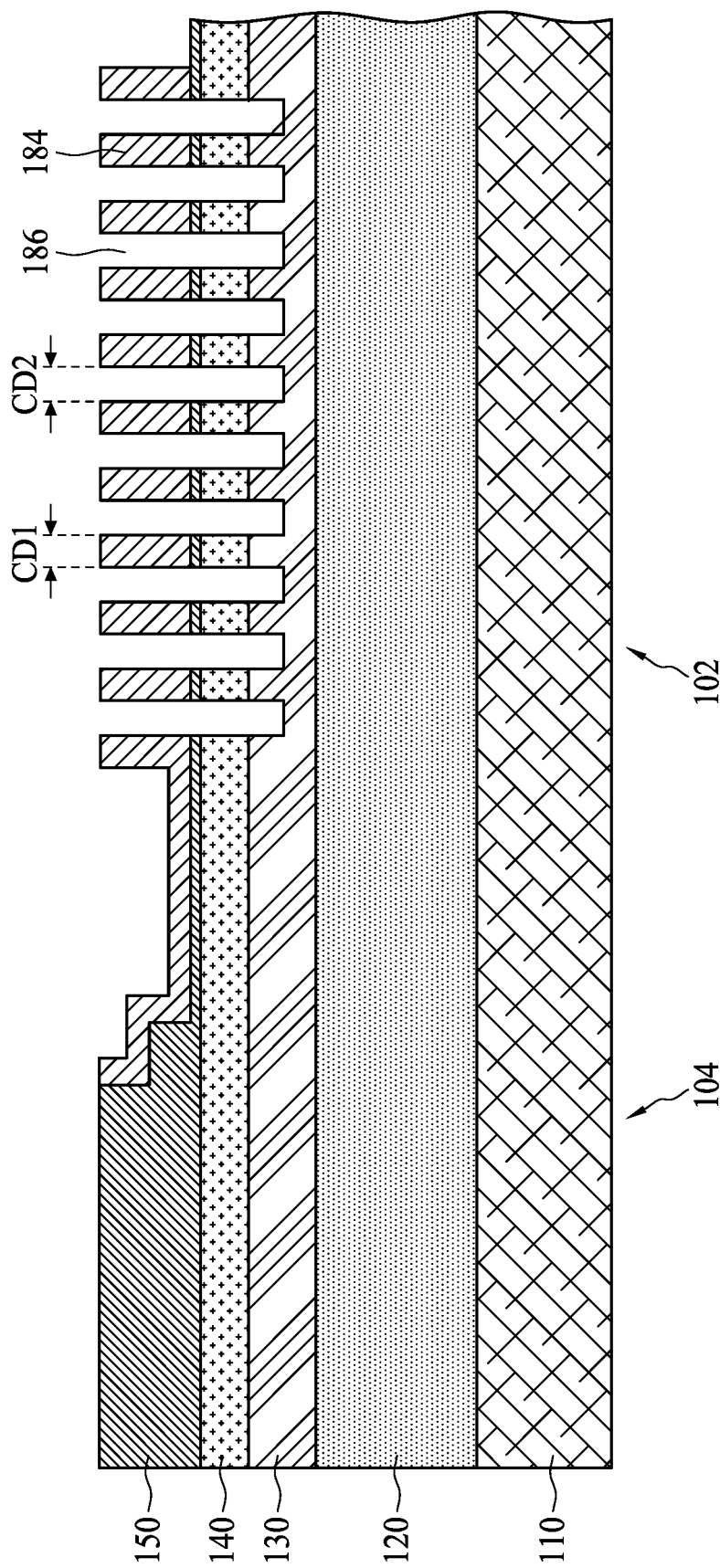

Referring to FIG. 11, a third etching process is performed to etch the first oxide layer 150, the second layer 140, and the stop layer 130 via the second spaces 182 to form a plurality of second lines 184 according to a step 316 shown in FIG. 1. In some embodiments, the stop layer 130 is exposed to the second spaces 182 after the performing of the third etching process. In some embodiments, a critical dimension CD1 of each of the plurality of second lines 184 is less than 37 nanometers. In some embodiments, the critical dimension of the second lines 184 is in a range of 20 nanometers to 24 nanometers. In some embodiments, the critical dimension of the second lines 184 is substantially equal to 24 nanometers. In some embodiments, a critical dimension CD2 of each of third spaces 186 formed between pairs of adjacent second lines is in a range of 11 nanometers to 15 nanometers. In some embodiments, the critical dimension CD2 of each of the third spaces 186 is substantially equal to 15 nanometers.

Figure 12:
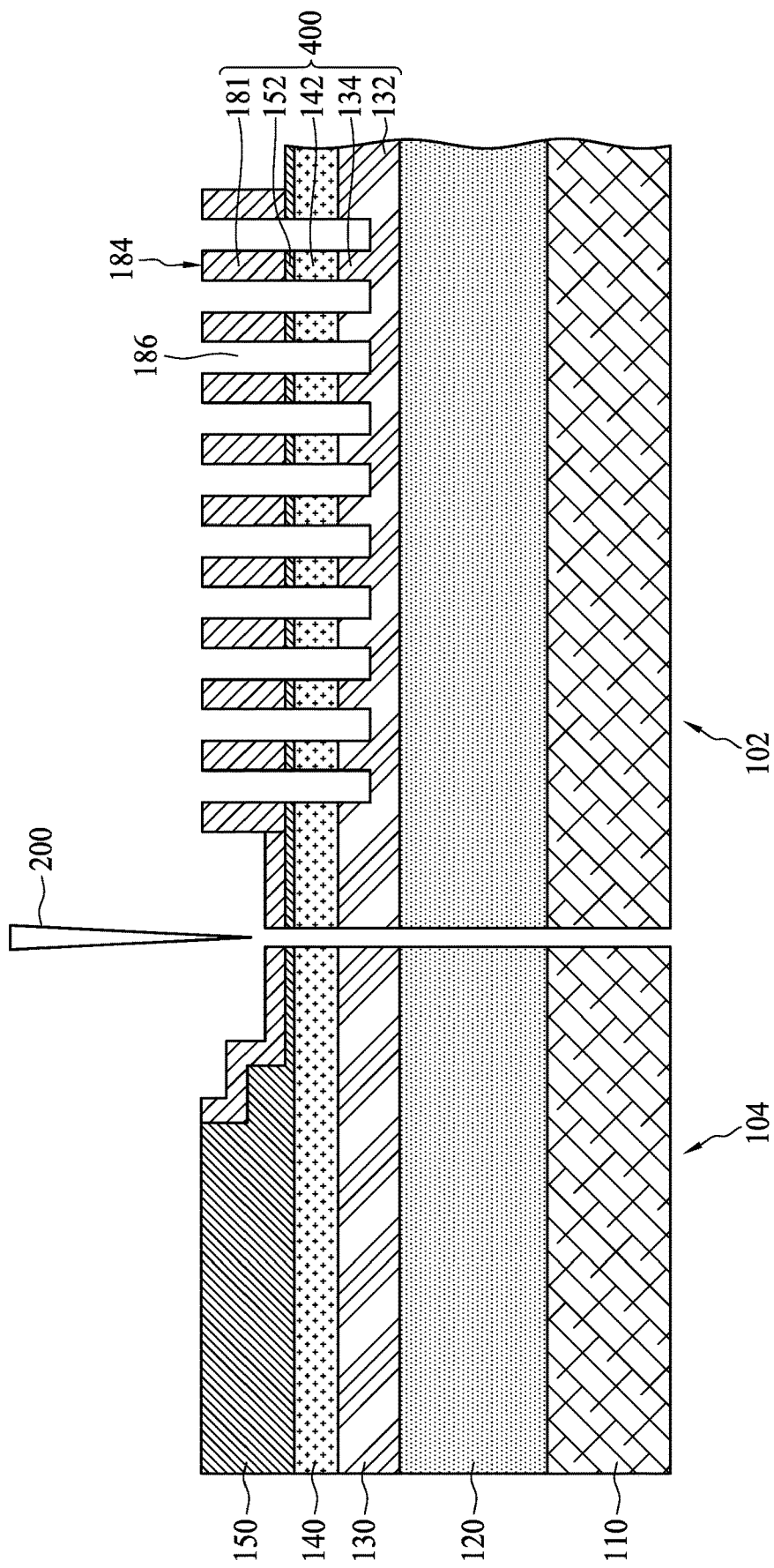

Referring to FIG. 12, the semiconductor structure shown in FIG. 11 is sawed into two parts, wherein one part includes stacked layers of the active area 102 and the other part includes stacked layers of the peripheral area 104. The semiconductor structure 102 of the active area 104 includes a nitride layer 110, a first layer 120, a stop layer 130, a second layer 140, a first oxide layer 150, and a second oxide layer 180. The first layer 120 is disposed on the nitride layer 110. The stop layer 130 is disposed on the first layer 120 and includes a base 132 and a plurality of the protrusions 134 disposed over the base 132. The second layer 140 is disposed on the stop layer 130 and has a plurality of segments 142 disposed over the protrusions 134, respectively. The first oxide layer 150 is disposed on the second layer 140 and has a plurality of first blocks 152 disposed over the segments 142, respectively. The second oxide layer 180 is disposed on the first oxide layer 150 and has a plurality of second blocks 181 disposed over the first blocks 152, respectively. A critical dimension of a stacked structure 400 including the protrusion 134, the segment 142, the first block 152, and the second block 181 stacked in sequence is substantially less than 37 nanometers.

In some embodiments, the critical dimension of the stacked structure 400 is substantially in a range of 20- to 24 nanometers. In some embodiments, a critical dimension of each of spaces between adjacent pairs of stacked structures 400 is substantially in a range of 11 15 nanometers.

One aspect of the present disclosure provides a semiconductor structure. The semiconductor structure includes a nitride layer, a first layer, a stop layer, a second layer, a first oxide layer, and a second oxide layer. The first layer is disposed on the nitride layer. The stop layer is disposed on the first layer and includes a base and a plurality of the protrusions disposed over the base. The second layer is disposed on the stop layer and has a plurality of segments disposed over the protrusions, respectively. The first oxide layer is disposed on the second layer and has a plurality of first blocks disposed over the segments, respectively. The second oxide layer is disposed on the first oxide layer and has a plurality of second blocks disposed over the first blocks, respectively.

One aspect of the present disclosure provides a method for preparing semiconductor structures. The method includes steps of providing a stack structure, wherein the stack structure comprises a nitride layer, a first layer, a stop layer, a second layer, and a first oxide layer stacked in sequence; forming a third layer on the first oxide layer; patterning the third layer to obtain a line-and-space pattern comprising a plurality of first lines and a plurality of first spaces; forming a second oxide layer on the line-and-space pattern; removing the second oxide layer on the first lines; removing the first lines to form a plurality of second spaces; and etching the first oxide layer, the second layer, and the stop layer via the second spaces to form a plurality of second lines.

By the method mentioned above, the critical dimensions of the stacked structure including the protrusion, the segment, the first block, and the second block stacked in sequence, and the space between adjacent pairs of stacked structures can meet requirements, and can facilitate the subsequent production processes.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing semiconductor structures, comprising steps of:
    providing a stack structure, wherein the stack structure comprises a nitride layer, a first layer, a stop layer, a second layer, and a first oxide layer stacked in sequence;
    forming a third layer on the first oxide layer;
    patterning the third layer to obtain a line-and-space pattern comprising a plurality of first lines and a plurality of first spaces;
    forming a second oxide layer on the line-and-space pattern;
    removing the second oxide layer on the first lines;
    removing the first lines to form a plurality of second spaces; and
    etching the first oxide layer, the second layer, and the stop layer via the second spaces to form a plurality of second lines.

2. The method of claim 1, wherein a critical dimension of each of the plurality of second lines is substantially less than 37 nanometers, and a critical dimension of each of a plurality of third spaces formed between adjacent pairs of second lines is in a range of 11 nanometers to 15 nanometers.

3. The method of claim 1, wherein the step of patterning the third layer to obtain the line-and-space pattern comprises:
    providing a photoresist layer on the third layer;
    patterning the photoresist layer;
    performing a first etching to remove a portion of the third layer; and
    stripping the photoresist layer.

4. The method of claim 3, wherein portions of the first oxide layer are exposed to the first spaces after the patterning of the third layer.

5. The method of claim 4, wherein a thickness of the second oxide layer formed on a top surface and a sidewall of each of the first lines and the first oxide layer is consistent.

6. The method of claim 1, further comprising:
    forming a fill material on the second oxide layer;
    removing the fill material over the first lines while removing the second oxide layer on the first lines; and
    completely removing the fill material while removing the first lines.

7. The method of claim 6, wherein the second oxide layer on the first lines and the fill material over the first lines are removed using a second etching process, which comprises using carbon tetrafluoromethane (CF4) as a reactive gas.

8. The method of claim 6, wherein the first lines and the fill material are removed by an ashing process, which comprises using oxygen (O2) as a reactive gas.

9. The method of claim 6, wherein a height of the fill material formed over the first lines is substantially less than a height of the fill material formed within the first spaces.

10. The method of claim 1, wherein portions of the first oxide layer are exposed to the second spaces.

11. The method of claim 1, wherein the semiconductor structure has an active area and a peripheral area encircling the active area, wherein the second lines and the second spaces are located in the active area.

12. The method of claim 11, wherein a height of the first oxide layer in the active area is less than a height of the first oxide layer in the peripheral area, and a height of the third layer in the active area is greater than a height of the third layer in the peripheral area, such that an upper surface of the third layer is substantially planar.

* * * * *